United States Patent
Kubena et al.

(10) Patent No.: US 11,563,420 B1
(45) Date of Patent: Jan. 24, 2023

(54) FEMTO-TESLA MEMS RF ANTENNA WITH INTEGRATED FLUX CONCENTRATOR

(71) Applicant: HRL Laboratories, LLC, Malibu, CA (US)

(72) Inventors: Randall L. Kubena, Oak Park, CA (US); Walter S. Wall, Malibu, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 557 days.

(21) Appl. No.: 16/775,242

(22) Filed: Jan. 28, 2020

Related U.S. Application Data (60) Provisional application No. 62/826,757, filed on Mar. 29, 2019.

(51) Int. Cl.
| | |
|---|---|
| H03H 9/22 | (2006.01) |
| H01L 41/12 | (2006.01) |
| H01Q 13/10 | (2006.01) |
| H03H 9/19 | (2006.01) |
| H03H 9/17 | (2006.01) |

(52) U.S. Cl.
CPC ............ *H03H 9/22* (2013.01); *H01L 41/125* (2013.01); *H01Q 13/10* (2013.01); *H03H 9/173* (2013.01); *H03H 9/19* (2013.01)

(58) Field of Classification Search
CPC . H03H 9/22; H03H 9/173; H03H 9/19; H01L 41/125; H01Q 13/10
See application file for complete search history.

(56) References Cited

U.S. PATENT DOCUMENTS

| | | |
|---|---|---|
| 4,314,204 A | 2/1982 | Biehl |
| 5,659,270 A | 8/1997 | Millen |
| 5,962,786 A | 10/1999 | Le Traon |
| 6,194,900 B1 | 2/2001 | Freeman |
| 6,483,480 B1 | 11/2002 | Sievenpiper |
| 6,812,903 B1 | 11/2004 | Sievenpiper |

(Continued)

FOREIGN PATENT DOCUMENTS

| | | |
|---|---|---|
| EP | 0496583 A2 | 7/1992 |
| WO | 2009-045576 | 4/2009 |
| WO | 2015-072985 | 5/2015 |

OTHER PUBLICATIONS

From U.S. Appl. No. 16/269,847, Office Action dated Apr. 27, 2020.

(Continued)

*Primary Examiner* — J. San Martin
(74) *Attorney, Agent, or Firm* — Ladas & Parry, LLP (57) ABSTRACT

A RF antenna or sensor has a substrate, a resonator operable at UHF disposed on the substrate, the resonator preferably having a quartz bar or body with electrodes disposed on opposing major surfaces thereof and with a magnetostrictive material disposed on or covering at least one of the electrodes. A pair of trapezoidal, triangular or wing shaped high permeability pole pieces preferably supported by that substrate are disposed confronting the resonator, one of the pair being disposed one side of the resonator and the other one of the pair being disposed on an opposing side of said resonator, the pair of high permeability pole pieces being spaced apart by a gap G, the resonator being disposed within that gap G. The size of gap G is preferably less than 100 μm.

20 Claims, 10 Drawing Sheets

(56) References Cited

U.S. PATENT DOCUMENTS

| | | | |
|---|---|---|---|
| 6,888,424 B2 | 5/2005 | Takeuchi | |
| 7,046,002 B1* | 5/2006 | Edelstein | G01R 33/0286 324/225 |
| 7,575,807 B1 | 8/2009 | Barvosa-Carter | |
| 7,716,985 B2 | 5/2010 | Zhang | |
| 7,750,535 B2 | 7/2010 | Kubena | |
| 7,774,155 B2 | 8/2010 | Sato | |
| 7,851,971 B2 | 12/2010 | Chang | |
| 7,892,630 B1 | 2/2011 | McKnight | |
| 7,892,876 B2 | 2/2011 | Mehregany | |
| 8,222,898 B1* | 7/2012 | Edelstein | G01R 33/0041 324/249 |
| 8,390,387 B2 | 3/2013 | Lander | |
| 8,760,157 B2 | 6/2014 | Miller | |
| 8,765,615 B1 | 7/2014 | Chang | |
| 8,803,751 B1 | 8/2014 | Miller | |
| 8,912,711 B1 | 12/2014 | Chang | |
| 9,211,690 B1 | 12/2015 | McKnight | |
| 9,250,074 B1 | 2/2016 | Kubena | |
| 9,250,452 B1 | 2/2016 | Yap | |
| 9,383,208 B2 | 7/2016 | Mohanty | |
| 9,825,610 B1 | 11/2017 | Churchill | |
| 9,879,997 B1 | 1/2018 | Kubena | |
| 9,977,097 B1 | 5/2018 | Nguyen | |
| 9,991,863 B1 | 6/2018 | Kubena | |
| 10,031,191 B1 | 7/2018 | Nguyen | |
| 10,110,198 B1 | 10/2018 | Kubena | |
| 10,126,376 B1 | 11/2018 | Nguyen | |
| 10,175,307 B1 | 1/2019 | Sorenson | |
| 10,177,737 B1 | 1/2019 | Kubena | |
| 10,266,398 B1 | 4/2019 | Kubena | |
| 10,308,505 B1 | 6/2019 | Kirby | |
| 10,389,392 B1 | 8/2019 | Kubena | |
| 10,585,150 B2* | 3/2020 | Bickford | G01L 1/12 |
| 2002/0166379 A1 | 11/2002 | Paros | |
| 2004/0194548 A1 | 10/2004 | Dayagi | |
| 2004/0263408 A1 | 12/2004 | Sievenpiper | |
| 2005/0082944 A1 | 4/2005 | Thompson | |
| 2005/0122115 A1 | 6/2005 | Maguire | |
| 2005/0174014 A1 | 8/2005 | Korden | |
| 2006/0160136 A1 | 7/2006 | Xiang | |
| 2007/0001773 A1 | 1/2007 | Oxborrow | |
| 2007/0017287 A1 | 1/2007 | Kubena | |
| 2007/0082642 A1 | 4/2007 | Hattori | |
| 2007/0180911 A1 | 8/2007 | Shoji | |
| 2007/0205849 A1 | 9/2007 | Otis | |
| 2007/0216406 A1 | 9/2007 | Witcraft | |
| 2008/0136418 A1 | 6/2008 | Renz | |
| 2008/0163689 A1 | 7/2008 | Thompson | |
| 2009/0003136 A1 | 1/2009 | Karr | |
| 2009/0109048 A1 | 4/2009 | Spivak | |
| 2009/0147254 A1 | 6/2009 | Kirby | |
| 2010/0176809 A1 | 7/2010 | Biber | |
| 2011/0062955 A1 | 3/2011 | Miller | |
| 2011/0062956 A1* | 3/2011 | Edelstein | G01R 33/0286 324/251 |
| 2013/0201316 A1 | 8/2013 | Binder | |
| 2013/0217979 A1 | 8/2013 | Blackadar | |
| 2014/0111019 A1 | 4/2014 | Roy | |
| 2014/0113828 A1 | 4/2014 | Gilbert | |
| 2015/0168503 A1* | 6/2015 | Kim | G01R 33/18 324/244 |
| 2015/0295320 A1 | 10/2015 | Lee | |
| 2015/0323694 A1 | 11/2015 | Roy | |
| 2016/0003924 A1 | 1/2016 | Sun | |
| 2016/0118954 A1 | 4/2016 | Clark | |
| 2016/0209478 A1 | 7/2016 | Forstner | |
| 2016/0380357 A1 | 12/2016 | Keller | |
| 2017/0141622 A1 | 5/2017 | Meichle | |
| 2017/0212060 A1 | 7/2017 | Hao | |
| 2017/0244377 A1 | 8/2017 | Yamane | |
| 2017/0276848 A1 | 9/2017 | Sinclair | |
| 2017/0345449 A1 | 11/2017 | Shibata | |
| 2017/0359025 A1 | 12/2017 | Kishi | |
| 2018/0040666 A1 | 2/2018 | Shibata | |
| 2018/0057409 A1 | 3/2018 | Rosseinsky | |
| 2018/0083595 A1 | 3/2018 | Kaida | |
| 2018/0115070 A1 | 4/2018 | Wang | |
| 2018/0198211 A1 | 7/2018 | Wall | |
| 2018/0226720 A1 | 8/2018 | Wall | |
| 2018/0248516 A1 | 8/2018 | Nota | |
| 2018/0302032 A1 | 10/2018 | Oya | |
| 2018/0323768 A1 | 11/2018 | Ikeda | |
| 2019/0072374 A1 | 3/2019 | Mann | |
| 2019/0123714 A1 | 4/2019 | Kizu | |
| 2019/0245254 A1 | 8/2019 | Yamane | |
| 2019/0250198 A1 | 8/2019 | Kubena | |
| 2021/0242606 A1 | 8/2021 | Sepulveda | |
| 2021/0249468 A1 | 8/2021 | Heron | |

OTHER PUBLICATIONS

T. Nan, et al., "Acoustically Actuated Ultra-Compact NEMS Magnetoelectric Antenna," Nature Communications, 8:296, DOI: 10.1038/541467-017-00343-8 (2017).

J. Zhai, et al., "Detection of Pico-Tesla Magnetic Fields using Magneto-Electric Sensors at Room Temperature," Applied Physics Letters, 88, 062510 (2006).

J. Vrba, SQUID Sensors: Fundamentals, Fabrication and Applications, edited by H. Weinstock, Kluwer Academic, Dordrecht, The Netherlands, 1996, p. 117.

Z. Yao, et al., "Bulk Acoustic Wave-Mediated Multiferroic Antennas: Architecture and Performance Bound," IEEE Transactions on Antennas and Propagation, vol. 63, No. 8, Aug. 2015.

S. P. Bennett, et al., "Magnetic Field Response of Doubly Clamped Magneto-Electric Microelectromechanical AlN-FeCo Resonators," Applied Physics Letters 111, 252903 (2017).

R. L. Kubena, et al. "Wide-band multiferroic quartz MEMS antennae" Journal of Physics: Conference Series, 2019.

From U.S. Appl. No. 15/965,652 (unpublished, non-publication request filed), Office Action dated Aug. 17, 2021.

From U.S. Appl. No. 15/965,652 (unpublished, non-publication request filed), Office Action dated May 20, 2021.

Pang et al., "Magnetostrictive-Based Quartz MEMS RF Sensors," 2018 IEEE International Frequency Control Symposium (IFCS), 2018, pp. 1-6, doi: 10.1109/FCS.2018.8597519. (Year: 2018).

U.S. Appl. No. 14/973,701, Wall, filed Jun. 29, 2017.

U.S. Appl. No. 15/899,122, Kubena, filed Feb. 19, 2018.

U.S. Appl. No. 15/965,652, Kubena, filed Apr. 27, 2018.

U.S. Appl. No. 16/370,602, Kubena, filed Mar. 29, 2019.

From U.S. Appl. No. 16/269,847 (now published as US 2019-0250198 A1), Office Action dated Oct. 17, 2019.

Azad, U., et al., "Direct Antenna Modulation (DAM) for Enhanced Capacity Performance of Near-Field Communication (NFC) Link," IEEE Transactions on Circuits and Systems—I: Regular Papers vol. 61, No. 3, pp. 902-910, Mar. 2014,.

Bennett, S.P., et al., "Magnetic Field Response of Doubly Clamped Magneto-Electric Microelectromechanical AlN—FeCo Resonators," Applied Physics Letters 111, 2017, 5 pages.

Filter Inductors—1812FS Series Datasheet, Oct. 12, 2015, retrieved online at: www.coilcraft.com/pdfs/1812fs.pdf.

Gamble, J.T., "Wideband Coherent Communication at VLF with the Experimental Transmitting Antenna Modulator (ETAM)," No. RADC-TR-73-287, Rome Air Development Center, Air Force Systems Command, Griffiss Air Force Base, NY, Dec. 1973.

Griffith, W.C. et al., "Miniature atomic magnetometer integrated with flux concentrators," Applied Physics Letters 94, 023502 (2009) (3 pages).

Hansen, R.C. et al., "Small Antenna Handbook," John Wiley & Sons, Inc., 2011, Chapter 3.

Hu, Z. et al., "Voltage Control of Magnetism in FeGaB/PIN-PMN-PT Multiferroic Heterostructure for High-Power and High-Temperature Applications," Applied Physics Letters, 106, 022901 (2015), 4 pages.

Kawashima, H., "New Cuts for Width-Extensional Mode Quartz Crystal Resonators," Electronics & Communications in Japan, Part 3, vol. 76, No. 12, pp. 28-36, Apr. 1993.

(56) References Cited

OTHER PUBLICATIONS

Kim, H.J. et al., "Piezoelectric/Magnetostructure MEMS Resonant Sensor Array for in-Plane Multi-Axis Magnetic Field Detection," IEEE MEMS 2017.

Kirby, et al. "Miniaturized VHF Quartz MEMs Resonator Design Methodology," 2017 Frequency Control Symposium, Jul. 10-13, 2017, Besancon, France.

Klemmer, T.J. et al., "Ultrahigh Frequency Permeability of Sputtered Fe—Co—B Thin Films," Journal of Applied Physics, vol. 87, No. 2, Jan. 15, 2000.

Kubena, R. "UHF Quartz MEMS Oscillators for Dynamics-Based System Enhancements," 2013 IEEE International Frequency Control Symposium, Prague, Czech Republic, Jul. 22-26, 2013 (8 pages).

Kubena, R., et al., "A Fully Integrated Quartz MEMS VHF TCXO," 2017.

Kubena, R., et al., "MEMS-based UHF Monolithic Crystal Filters for Integrated RF Circuits," Journal of Microelectromechanical Systems, vol. 25, No. 1, pp. 118-124, Feb. 2016.

Kubena, R., et al., "Next Generation Quartz Oscillators and Filters for VHF-UHF Systems," 2006 IEEE International Microwave Symposium, San Francisco, CA, Jun. 11-16, 2006, pp. 668-671.

Li, M. et al., "Ultra-Sensitive MEMS Magnetoelectric Sensor for Picotesla DC Magnetic Field Detection" MEMS 2017, Applied Physics Letter, 110 (2017).

Liang, C-Y et al.,"Modeling of Magnetoelastic Nanostructmes with a Fully Coupled Mechanical-Micro magnetic Model," Nanotechnology 25 (2014).

Nan, T. et al., "Acoustically Actuated Ultra-Compact NEMS Magnetoelectric Antennas," Nature Communications, 8:296 (2017).

Statek, CX1SM Crystal Datasheet, first accessed Mar. 14, 2016.

Ungan, T., et al., "RF Energy Harvesting Design Using High Q Resonators," IEEE MTT-S International Microwave Workshop on Wireless Sensing, Local Positioning, and RFID, IMWS 2009, pp. 1-4, IEEE, 2009 (4 pages).

Vrba, J., SQUID Sensors: Fundamentals, Fabrication and Applications, edited by H. Weinstock Kluwer Academic, Dordrecht, The Netherlands, 1996 p. 117.

Yao, Zhi, et al.,"Bulk Acoustic Wave Mediated Multiferroic Antennas: Architecture and Performance Bound," IEEE Transactions on Antennas and Propagation, vol. 63, No. 8, Aug. 2015, pp. 3335-3344.

Zhai, J. et al., "Detection of Pico-Tesla Magnetic Fields using Magnetic-Electric Sensors at Room Temperature," Applied Physics Letters 88, (2006).

\* cited by examiner

FEMTO-TESLA MEMS RF ANTENNA WITH INTEGRATED FLUX CONCENTRATOR

CROSS REFERENCE TO RELATED APPLICATIONS

This application claims the benefit of U.S. Provisional Patent Application Ser. No. 62/826,757 filed on Mar. 29, 2019 and entitled "A femto-Tesla MEMS RF Antenna with Integrated Flux Concentrator", the disclosure of which is hereby incorporated herein by reference.

This application is related to U.S. Provisional Patent Application Ser. No. 62/521,174, filed Jun. 16, 2017 and entitled "A Quartz MEMS Piezoelectric Resonator for Chip-scale RF Antennae" and a corresponding non-provisional application Ser. No. 15/965,652, filed Apr. 27, 2018 with the same title. The disclosures of each of these applications are hereby incorporated herein by reference.

This application is also related to U.S. Provisional Patent Application Ser. No. 62/678,897, filed May 31, 2018 and entitled "Broadband Integrated RF Magnetic Antenna" and a corresponding non-provisional application Ser. No. 16/370,602, filed on Mar. 29, 2019 and also entitled "Broadband Integrated RF Magnetic Antenna". The disclosures of each of these applications are hereby incorporated herein by reference.

STATEMENT REGARDING FEDERALLY SPONSORED RESEARCH OR DEVELOPMENT

None.

TECHNICAL FIELD

This technology disclosed herein increases the sensitivities of magnetostrictively-driven piezoelectric resonators and antennas and more particularly relates to magnetostrictively-driven piezoelectric resonators and antennas with integrated magnetic flux concentrators.

BACKGROUND

Magnetostrictively-driven piezoelectric resonators offer the possibility of sensing magnetic RF fields with high sensitivity with extreme sub-wavelength ($<<\lambda$) structures and at room temperature. See, for example, T. Nan, et. al., "Acoustically Actuated Ultra-Compact NEMS Magnetoelectric Antenna," *Nature Communications*, 8:296, DOI: 10.1038/s41467-017-00343-8 (2017) and J. Zhai, et. al., "Detection of Pico-Tesla Magnetic Fields using Magneto-Electric Sensors at Room Temperature," *Applied Physics Letters*, 88, 062510 (2006).

The sensitivity can be enhanced by the high mechanical gain (Q) of the resonator, thereby amplifying the voltage produced by the resonator. In addition, the magnetic layer of the resonator can introduce a modulated strain in the piezoelectric resonator which can shift an oscillation frequency if the resonator is used with a feedback sustaining circuit. This frequency shift can then be used as a measure of the amplitude of the incident magnetic field. Both antenna designs can be implemented in a wafer-level (yielding ultra-thin antennas) process with high-Q quartz resonators using the HRL QMEMS process. See the patent applications referenced above. In particular note that the presently disclosed resonator design with wing shaped high permeability pole pieces can be used to improve the sensitivity of the Broadband Integrated RF Magnetic Antenna taught by U.S. Provisional Patent Application Ser. No. 62/678,897, filed May 31, 2018 and entitled "Broadband Integrated RF Magnetic Antenna" and a corresponding non-provisional application Ser. No. 16/370,602, filed Mar. 29, 2019 and also entitled "Broadband Integrated RF Magnetic Antenna". See the embodiment of FIG. 5 of that application.

Currently, there is hope that these devices can achieve noise floors similar to quantum-based SQUID devices (~1 fT/√Hz) which require cryogenic cooling to 4.2 K. See J. Vrba, *SQUID Sensors: Fundamentals, Fabrication and Applications*, edited by H. Weinstock, Kluwer Academic, Dordrecht, The Netherlands, 1996, p. 117. This sensitivity corresponds to detecting an electric field noise of ~0.3 μV/m√Hz and is comparable to the sensitivity of a reasonably efficient dipole antenna optimized in size for the frequency of interest. However, even by incorporating high Q resonators with high permeability ($\mu_r$>1000) magnetic films, the predicted sensitivities for many state of the art magnetostrictively-driven resonators is near 100 fT/√Hz to 1 pT/√Hz. In order to achieve SQUID-like performance with a small MEMS-based resonator, an additional gain in sensitivity of roughly two order of magnitude is desirable. In this disclosure, we describe an integrated thin-film magnetic flux focusing structure for increasing the sensitivity of MEMS antennas. Since the typical size of the MEMS resonators is less than 1 mm, by fabricating magnetic poles which taper from ~5-50 mm to 0.1-1 mm one can increase the flux density by a factor of 50-100. By fabricating the magnetic poles on the same vertical plane as the magnetostrictive layer on the resonator and reducing the gap between the pole tip and the resonator to a fraction of the resonator dimension, the fringing field effects can be minimized. Since the lateral size of the antenna is usually not critical for most applications, the addition of the in-plane focusing structures does not reduce the potential applications of the technology.

In summary, in order to obtain the best RF sensitivity possible regardless of the size and power available, current MEMS-based magnetostrictive antennas need to improve their sensitivities by several orders of magnitude. There are various approaches to obtain that improvement. For on-resonant antennas that produce an output voltage for a given input magnetic field, several antennas can be arrayed in series to increase the voltage output. Alternatively, built-in vertical magnetic moments are predicted to strongly increase the coupling to shear-mode resonators. However, when used to detect a frequency shift for wide bandwidth applications, other methods are required. One could increase the stress applied to the resonator for a given magnetic field using alternate resonator designs or one can increase the local magnetic field that the resonator sees. This disclosure describes a fabrication method and geometry that allows for a large (~50-100 times) increase in magnetic field applied using in-plane flux concentrators with small gap spacings. The described fabrication is compatible with a QMEMS wafer-level process.

Several active research groups in this area include UCLA, Northeastern University, NRL, and Virginia Tech. Each have published in this area. The UCLA experimental work has involved using YIG/ZnO BAW (see Z. Yao, et. al., "Bulk Acoustic Wave-Mediated Multiferroic Antennas: Architecture and Performance Bound," *IEEE Transactions on Antennas and Propagation*, Vol. 63, No. 8, August 2015) and SAW resonators with FeCoB magnetostrictive films. The Northeastern Univ. group have used AlN resonators with FeGaB magnetostrictive films (see T. Nan, et. al., "Acoustically Actuated Ultra-Compact NEMS Magnetoelectric Antenna," *Nature Communications*, 8:296, DOI: 10.1038/s41467-017-

00343-8 (2017)). The Virginia Tech work involved Terfenol-D plates bonded with adhesives to PZT piezoelectric plates (see J. Zhai, et. al., "Detection of Pico-Tesla Magnetic Fields using Magneto-Electric Sensors at Room Temperature," *Applied Physics Letters,* 88, 062510 (2006)). The UCLA and Northeastern piezoelectric devices had $Qs \leq 1000$ in the VHF to UHF bands and had high temperature sensitivities. Most all of these groups have studied the direct conversion of the magnetic field to a piezoelectrically produced voltage. However, recently, NRL/Univ. of Penn./Carnegie Mellon have published results of an AlN—FeCo magnetic sensor in which a frequency shift was used to detect low frequency applied magnetic fields (see S. P. Bennett, et. al., "Magnetic Field Response of Doubly Clamped Magneto-Electric Microelectromechanical AlN—FeCo Resonators," *Applied Physics Letters* 111, 252903 (2017)). The frequency shift is produced by the change in the elastic modulus of the resonator as a function of the applied magnetic field and resulting stress. A sensitivity of 35 $pT/\sqrt{Hz}$ was derived.

All previous MEMS groups have reported sensitivities in the $pT-nT/\sqrt{Hz}$ range with the exception of the Virginia Tech work which reported a sensitivity on resonance (78 kHz) of 2 $fT/\sqrt{Hz}$ using a larger and thicker laminate structure (two $14 \times 6 \times 1.2$ mm$^3$ Terfenol-D plates). Our results show that for a bias magnetization in the vertical (out-of-plane) direction, sensitivities near 1 $fT/\sqrt{Hz}$ are obtainable on resonance at 10 MHz with over three orders of magnitude thinner sputtered film. This makes the wafer-level processing of these devices practical. However, for a broadband implementation using a phased locked loop (PLL), the sensitivity drops to roughly 2 $pT/\sqrt{Hz}$, with the highest sensitivity predicted for in-plane biasing. In-plane biasing can be accomplished during a deposition of the magnetostrictive film by applying a magnetic field to the devices in the deposition equipment. The magnitude of this magnetic field may be experimentally determined for highest sensitivity since its ideal value can be affected by residual stresses in the magnetostrictive film. However, enhanced sensitivities are still important for satisfying existing drop-in replacement markets with smaller antennas.

BRIEF DESCRIPTION OF THE INVENTION

In one aspect the present invention provides a RF antenna or sensor comprising a magnetostrictive material deposited on an acoustic resonator in which preferably trapezoidal, triangular or wing shaped high permeability pole pieces are located closely adjacent to the magnetostrictive material occupying at least the same vertical plane as the magnetostrictive material for the purpose of enhancing the magnetic field strength in the magnetostrictive material and on either side of the acoustic resonator.

The acoustic resonator is preferably a quartz resonator.

The high permeability pole pieces are located closely adjacent to the magnetostrictive material of the acoustic resonator so that a gap between the high permeability pole pieces does not exceed 100 µm.

In another aspect the present invention provides a RF antenna or sensor having a substrate; an acoustic resonator operable at UHF disposed on said substrate, the acoustic resonator having a quartz slab with electrodes disposed on opposing major surfaces thereof and with a magnetostrictive material disposed on or covering at least one of said electrodes; and a pair of trapezoidal, triangular or wing shaped high permeability pole pieces supported by said substrate are disposed on either side of the acoustic resonator, one of said pair being disposed one side of said acoustic resonator and the other one of said pair being disposed on an opposing side of said acoustic resonator, the pair of high permeability pole pieces being spaced apart by a gap G, the acoustic resonator being disposed within said gap. Preferably, a major portion of the gap G is no wider than 100 µm.

BRIEF DESCRIPTION OF THE DRAWINGS

FIG. 1 is perspective view while

DETAILED DESCRIPTION

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to (i) all papers and documents which are filed concurrently with this specification and which are open to public inspection with this specification (the contents of all such papers and documents are incorporated herein by reference) and (ii) all papers and documents which are otherwise incorporated by reference herein (but not physically filed with this specification).

All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the claims herein is not intended to invoke the provisions of 35 U.S.C. 112, Paragraph 6.

Fabrication processes for quartz MEMS devices have been described in previous U.S. Pat. Nos. 7,750,535, 7,851, 971, 8,765,615, 10,110,198, and 10,389,392, the disclosures of which are hereby incorporated herein by reference. These patents describe starting with a quartz resonator wafer and depositing top-side electrode metal and the interconnect metal for running to bond pads. However, in the embodiments disclosed herein a magnetostrictive film such as FeGaB or FeCoB is deposited on the resonator, preferably with a sputtering process, either soon before or soon after metallic electrodes are formed. Additionally, wing-shaped bodies of high permeability film such as mu-metal, ferrite, FeGaB or FeCoB are deposited immediately adjacent (but spaced from) the magnetostrictive film deposited on the resonator. The wing-shaped bodies do not need to be magnetostrictive.

Figure 1:
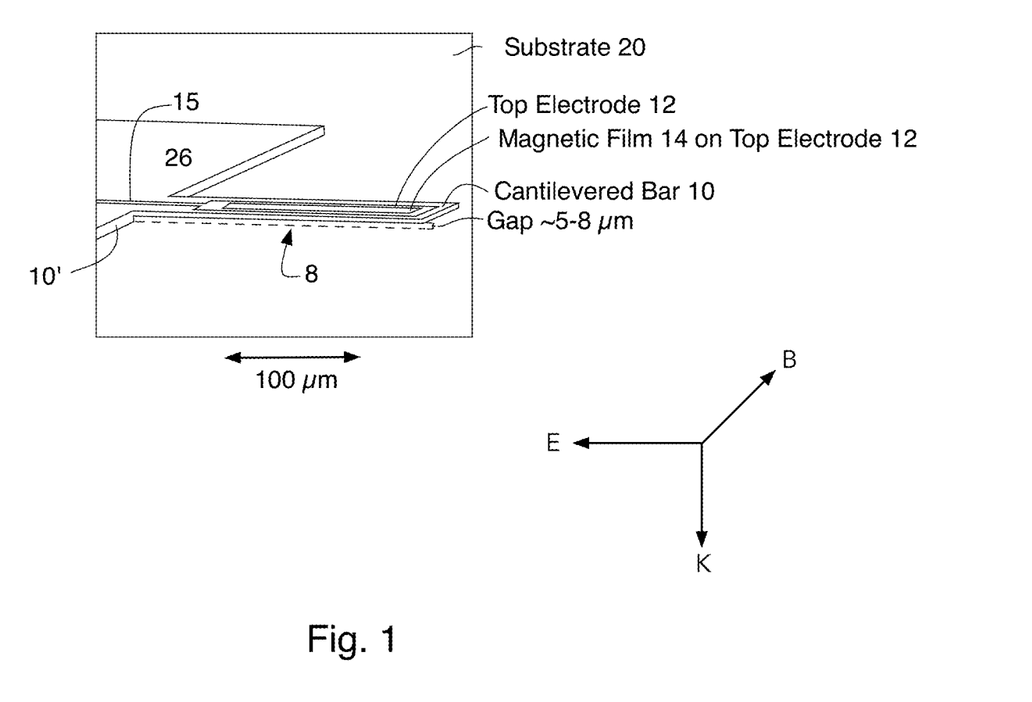
Figure 1A:
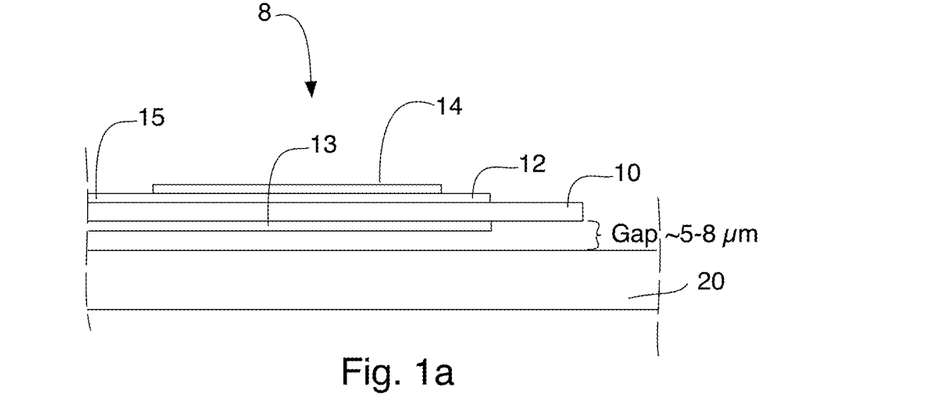
FIG. 1a is a side view of magnetically-induced cantilevered piezoelectric MEMS shear-mode resonator of FIG. 1
Figure 1B:
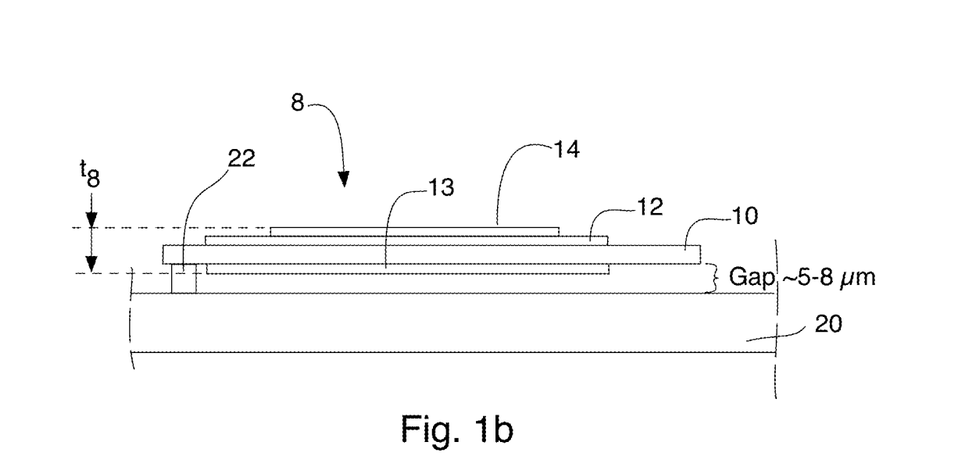
FIG. 1b is a side view of a somewhat different embodiment of a magnetically-induced piezoelectric MEMS shear-mode resonator.

FIG. 1 is perspective view of a cantilevered embodiment while FIG. 1a is a side view of a field-enhanced magnetically-induced cantilevered piezoelectric MEMS shear-mode resonator antenna of FIG. 1. FIG. 1b is a side view of a somewhat different embodiment of a field-enhanced magnetically-induced piezoelectric MEMS shear-mode resonator antenna where the bar 10 is supported by pads 22. What is not shown in these figures are the wing-shaped magnetic field concentrators or pole pieces 24 of a high permeability material such as a ferrite or FeGaB deposited lithographically near the magnetostrictively-driven piezoelectric antenna. These wing-shaped magnetic field concentrators or pole pieces 24 can be seen in FIGS. 2 and 3a, 3b, 4, 5 and 7.

One technique for making the quartz shear-mode antenna with a magnetostrictive material or film 14 applied to a top electrode 12 can be understood with reference to FIGS. 1, 1a and 1b, FIG. 1 providing a perspective view while FIG. 1a providing a side elevational view thereof and FIG. 1b providing a side elevational view of a slightly different embodiment where pads 22 support a cantilevered bar or body 10 above substrate 20. The top electrode 12 and a bottom electrode 13 are preferably formed of Au which may be deposited or otherwise formed on the resonating bar 10 of the resonator 8 which preferably comprises a cantilevered bar or body 10 of AT-cut quartz material with a total frequency variation over temperature of less than 50 ppm (commonly referred to as temperature-compensated quartz). The cantilevered bar or body 10, preferably formed of AT-cut quartz material, may be disposed over (and supported by) a semiconductor substrate 20 such as silicon or a group III-V semiconductor material system semiconductor and spaced therefrom by a gap preferably in the range of about 5 to 8 µm. The cantilevered bar or body 10 may extend from (and be unitary with) a relatively thicker portion 10' of the quartz body so that the relatively thicker portion 10' may be affixed to the semiconductor substrate 20 while maintaining the aforementioned gap between the relatively thinner cantilevered portion and the semiconductor substrate 20 as shown in FIGS. 1 and 1a. Alternatively or additionally, the cantilevered bar or body 10 of AT-cut quartz material may be supported from substrate 20 by a pair of mounting pads 22 (see also FIG. 2) at or near one end of the cantilevered bar or body 10.

The resonator 8 is preferably very small in size compared to the wavelength of the magnetic field that it senses. FIG. 1 includes an arrow showing a dimension of 100 µm giving an indication of the size of the depicted resonator 8. The resonator 8 of FIG. 1 can operate at frequencies in the range of 500-700 MHz with electrodes 12, 13 (see also FIG. 1a or 1b) having a length of about 150 µm and a width of about 50 µm. So the overall length of the quartz resonator 8 could well be under 200 µm. A wavelength at 10 MHz is around 30 m. So compared to a conventional ½ wave antenna, the resonator 8 is four to five orders of magnitude smaller than a conventional ½ or ¼ wave antenna.

A shear-mode AT-cut resonator 8 can be made more sensitive to a magnetic field in the crystal's X direction if a pre-magnetization is applied in the vertical out-of-plane or in the crystal's in-plane X or Z directions to the magnetostrictive material or film 14 during deposition. So, preferably, in-plane biasing is accomplished, during deposition of the magnetostrictive material or film 14, by applying a magnetic field to the resonator(s) 8 disposed in the deposition equipment being utilized. The magnitude of this magnetic field may be experimentally determined for highest sensitivity of the resulting resonator(s). The ideal value of the magnetic field can be affected by residual stresses in the magnetostrictive material or film 14 so it is best determined experimentally.

The resonator 8 preferably has two electrodes disposed thereon, a top electrode 12 and an opposing bottom electrode 13. Both electrodes 12, 13 may be formed of Al or Au or some other electrically conductive material(s). The electrodes 12, 13 have associated conductors 15 which may be couple to the sustaining circuits (not shown) via, for example, pads 22 in the case of the embodiment of FIG. 1b. Resonator antenna 8 has at least one of its electrodes, and preferably its top electrode 12, at least partially covered with a layer or film of the magnetostrictive material or film 14 disposed thereon as shown on FIGS. 1, 1a and 1b. The lower electrode 13 of resonator 8 may optionally or alternatively be provided with a layer or film of a magnetostrictive material or film 14.

The magnetostrictive material film 14 may be a ferromagnetic material which exhibits a magnetostrictive (or a magneto-elastic) effect, such as Ni, Terfenol-D, FeGa, FeGaB, MnZn Ferrite, FeCoB, Alfenol, and/or perhaps certain MetGlas® alloys. There are other magnetostrictive materials than those identified above which may be utilized or which may be developed in the future for film magnetostrictive material 14. It is to be understood that the discovery of new materials which are highly magnetostrictive or magnetoelastic (a magnetic film whose elastic constants are a function of applied magnetic field) is ongoing and moreover the discovery of new materials which exhibit very little magnetostrictiveness is also on going. So current magnetic materials can exhibit little or relatively large amounts of magnetostrictiveness. In this disclosure the term magnetostrictive material(s) or magnetostrictive material or film is intended to refer to magnetic materials whose magnetostrictiveness is described by the piezomagnetic coefficient (the differential change in the strain versus a change in the magnetic field) which is equal to or greater than 1 ppm/Oe.

The bar 10 of resonator is preferably mounted in a cantilevered fashion from one end of the bar 10 as shown in FIGS. 1, 1a and/or 1b.

Figure 2:
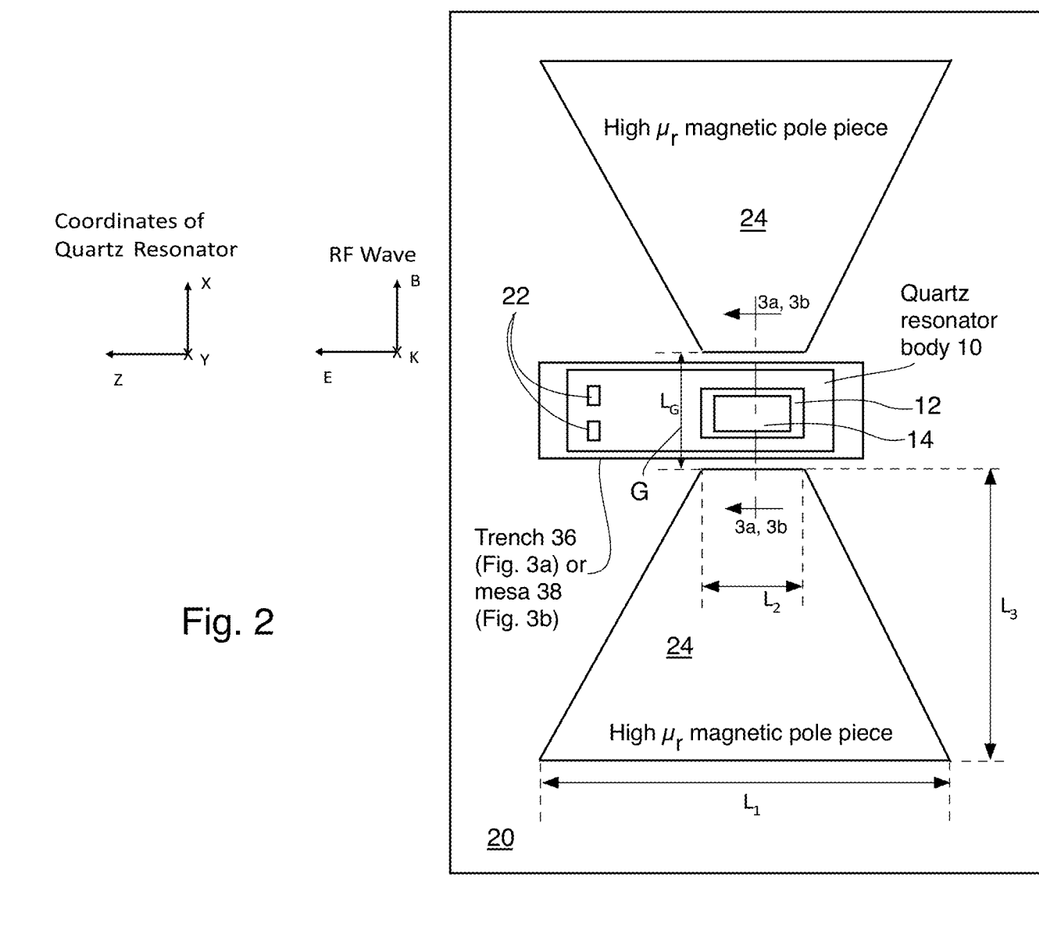
FIG. 2 is a top view of magnetostrictively driven antenna with local magnetic field enhancements using tapered high permeability pole pieces defined near the piezoelectric resonator.

A top view of the geometry of the field-enhanced magnetostrictively-driven piezoelectric antenna is shown in FIG. 2. A high permeability material such as a ferrite or FeGaB is deposited preferably lithographically near the magnetostrictively-driven piezoelectric antenna of FIG. 1, 1a or 1b, for example, to define wing-shaped pole pieces 24 for focusing the field magnetic lines of flux 23 (see FIG. 4) into resonator 8. In FIG. 2 it is assumed that bar 10 is cantilevered according to the embodiment of FIG. 1b although non-cantilevered bars may also be utilized. The magnetic flux focusing pole pieces 24 preferably have a tapered or wing-shaped geometry to trap the magnetic flux present over the length $L_1$ of the pole piece 24 and focus them near the smaller edge $L_2$. It is desirable to reduce a gap G between the magnetic pole pieces 24 in which the resonator 8 is inserted and to keep the magnetic material 14 on the piezoelectric resonator 8 in a common vertical plane as the pole pieces 24 to reduce fringing field effects near the resonator 8. The length of gap G is $L_G$.

Figure 3A:
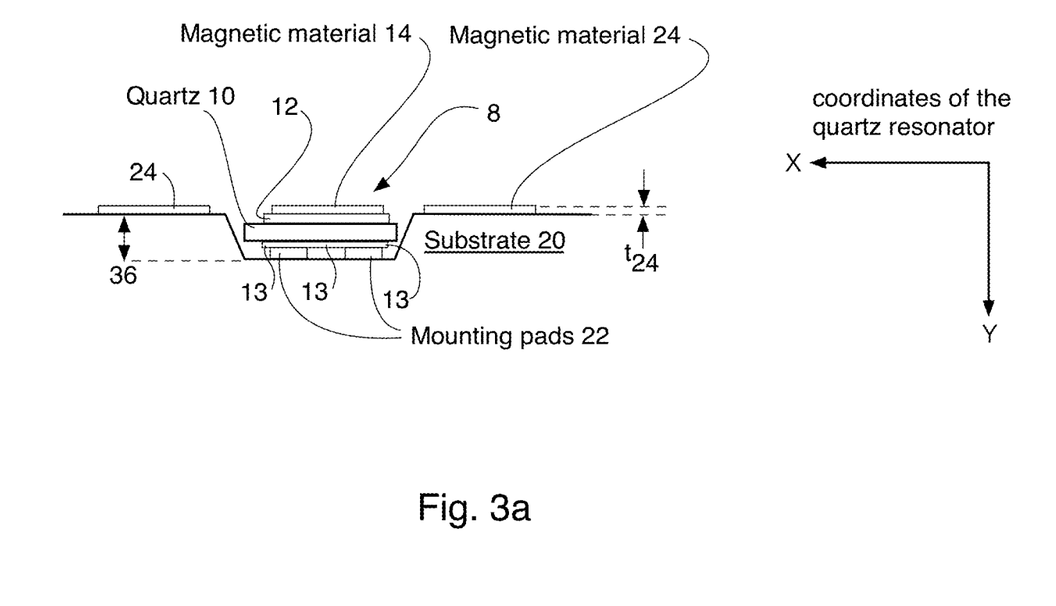
FIG. 3a is a side view of a magnetostrictively driven antenna with local magnetic field concentrators. The magnetic focusing pole pieces are defined on the same vertical plane as the magnetostrictive material on the piezoelectric resonator for high field coupling by placing the piezoelectric resonator in a trench.
Figure 3B:
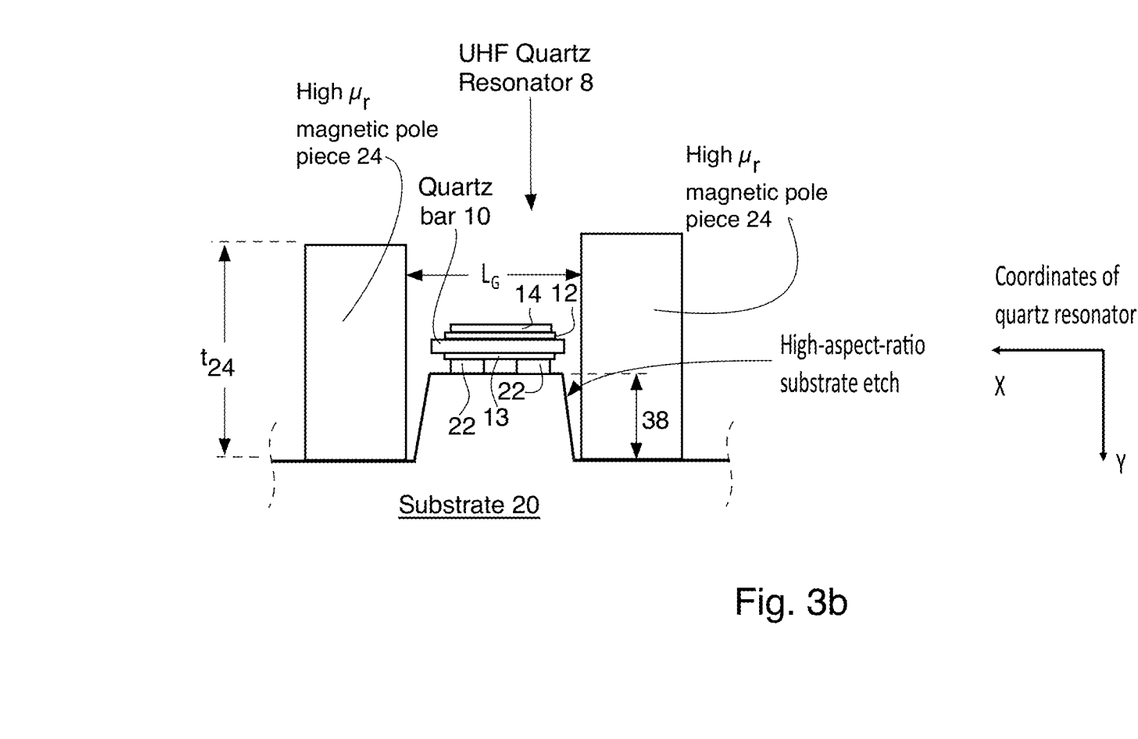
FIG. 3b is a side view of a magnetostrictively driven antenna with local magnetic field concentrators. The magnetic antenna is mounted on a high-aspect-ratio etched mesa positioning the antenna at the vertical mid-plane of the magnetic poles for high field coupling.
Figure 4:
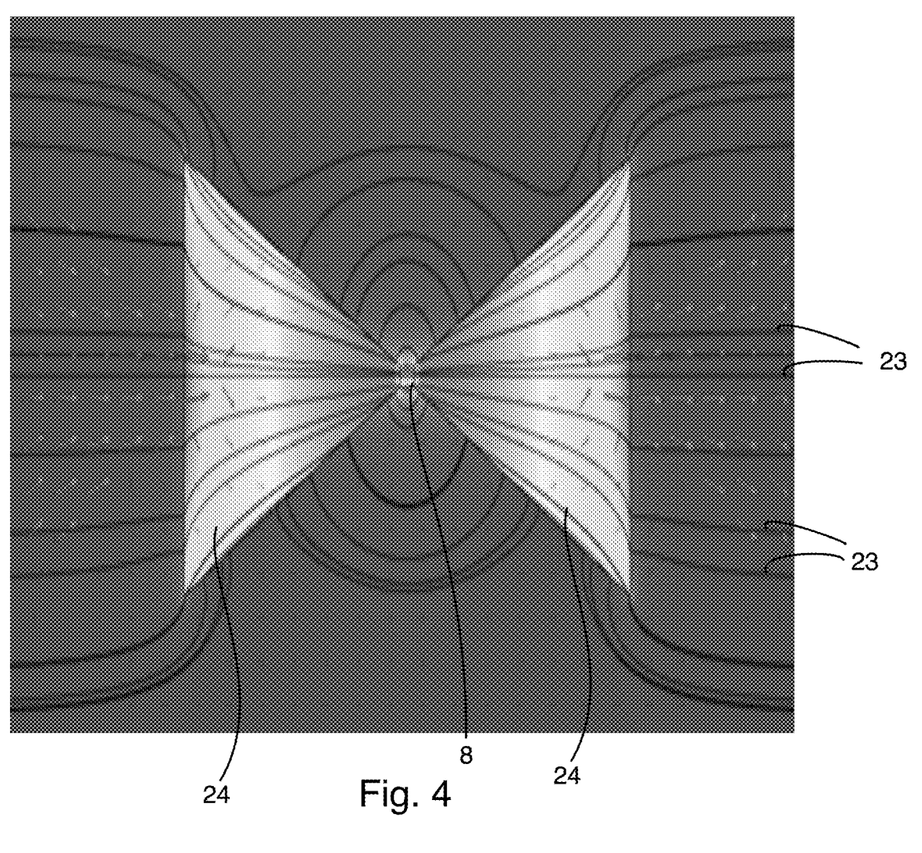
FIG. 4 presents a Finite Element Analysis (FEA) of a magnetic flux concentrator using mu-metal with a relative permeability $\mu_r$ of $3 \times 10^4$.

Side views of two different embodiments the field-enhanced magnetostrictively-driven antenna are shown in FIGS. 3a and 3b, which side views are taken along centerline 3a, 3b of FIG. 2. The resonator is bonded to a substrate 20 preferably using a low-temperature, wafer-level process (for example, an Au/In or an Au/Sn eutectic bond) in a trench having a depth 36 (see FIG. 3a) or on a mesa having a height 38 (see FIG. 3b) etched in the substrate 20 to preferably center either magnetostrictive material 14 of the resonator 8 or the resonator 8 itself with the thickness $t_{24}$ of the magnetic material which forms the magnetic poles 24. While the thickness $t_{24}$ of the magnetic material is shown as constant in FIGS. 3a and 3b, it is within the principles of the present invention to vary the thickness $t_{24}$ such that the thickness $t_{24}$ decreases nearer to the resonator 8 or increases farther from the resonator 8. In a non-limiting example, the thickness $t_{24}$ of the magnetic material may increase linearly with distance (in the x-direction, with reference to the figures of the present disclosure) away from the resonator 8. In another non-limiting example, the thickness $t_{24}$ of the magnetic material may increase non-linearly with distance away from the resonator 8.

It is preferred to restrict the gap G spacing between the poles pieces 24 to a dimension $L_G$ that is smaller than the width dimension $L_2$ at the tip of the flux concentrating poles pieces 24. For example, for a dimension of $L_2$ equal to 150 µm, it is preferred to keep the gap G spacing $L_G$: 150 µm. This may be accomplished using a UHF rectangular shear-mode resonator 8 with a resonator length in the Z direction of ~150 µm and a width in the X direction of ~50 µm. A resonator capable of operation at 1 GHz may have a width in the X direction as short as 25 µm. For UHF resonators with thicknesses $t_8$ of roughly 1-4 µm, the trench (see the embodiment of FIG. 3a) in the substrate can be etched with a plasma etch process providing steep profiles. Thus, the separation spacing $L_G$ between the pole pieces will be principally determined by the width of the resonator and as will be seen the gap G spacing $L_G$ should be maintained less than 100 µm if at all possible. And that should be readily accomplished given the size of resonator 8 depicted by FIG. 1 with the arrow of length 100 µm showing the approximate size of a resonator 8 that can operate at frequencies in the range of 500-700 MHz (UHF frequencies).

FIGS. 3a and 3b are side elevational views where the substrate 20 is subjected to a high aspect ratio etch either to form a trench having a depth 36 (FIG. 3a) or a mesa having a height 38 (FIG. 3b). The thickness (or height) of the flux concentrating pole pieces 24 is labeled "$t_{24}$". The embodiment with a mesa 38 is preferred since that embodiment allows for the flux concentrating pole pieces 24 to be considerably higher (thicker) yet allows them to be centered (height-wise) relative to resonator quartz 10. As will be discussed below with reference to FIGS. 5 and 6, as the thickness $t_{24}$ of the flux concentrating pole pieces 24 increases there is an improvement in the magnetic flux concentration occurring due to the flux concentrating pole pieces 24. Also, it should be apparent that the trench having a depth 36 and mesa having a height 38 could be omitted in an embodiment where the flux concentrating pole pieces would be thicker than in the embodiment of FIG. 3a but less thick than in embodiment of FIG. 3b.

Increasing the thickness $t_{24}$ of the flux concentrating pole pieces 24 relative to the thickness $t_8$ of the resonator 8 improves the field enhancement provided by the pole pieces 24 as will now be discussed with respect to FIGS. 5 and 6.

Figure 5:
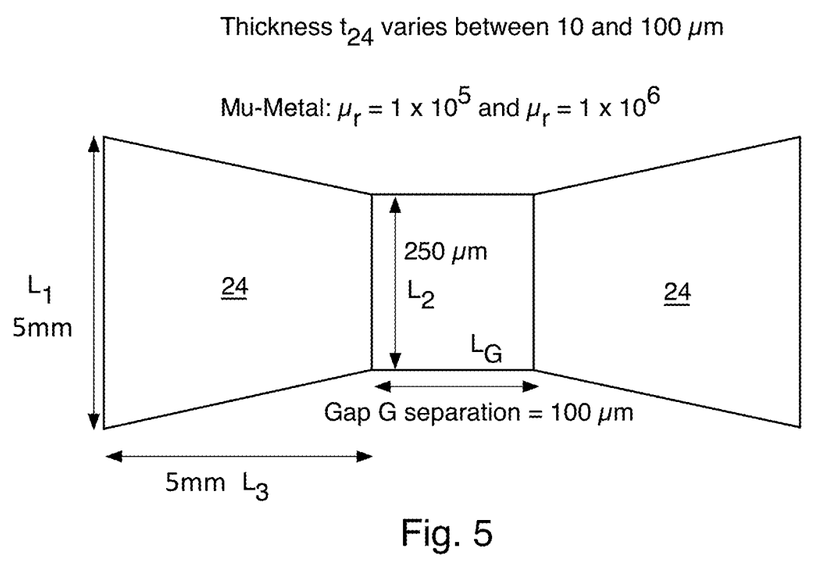
FIGS. 5 and 6 demonstrate an enhancement factor due to the presence of local magnetic field concentrators with a fixed gap spacing between them but with varying thicknesses.
Figure 6:
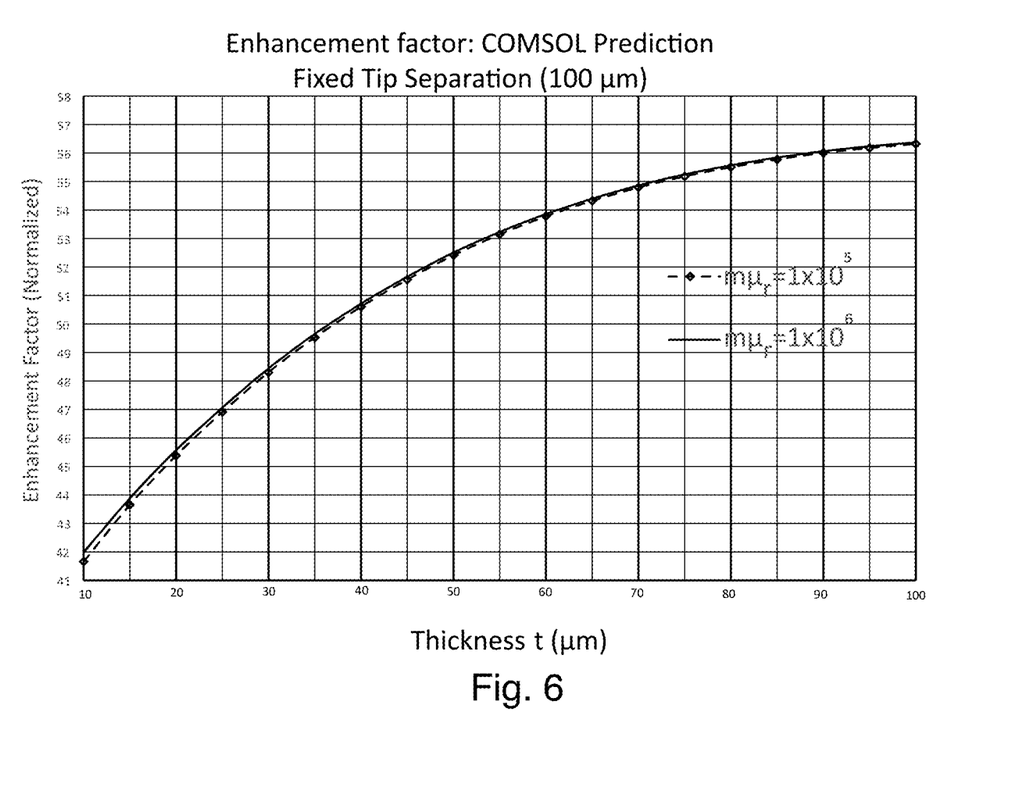

FIG. 5 is a schematic representation of a pair of flux concentrating pole pieces 24 having a fixed G equal to 100 µm but with a thickness $t_{24}$ varying between 10 and 100 µm. An example of the field enhancement obtainable with a 100 µm size gap G is shown in FIG. 6 with varying flux concentrating pole piece 24 thickness $t_{24}$. The field enhancement was modeled with an FEA modeling tool and shows about a 50× improvement with a thickness $t_{24}$ of about 40 µm at an operating frequency around 840-900 MHz. But even if the thickness $t_{24}$ is only 10 µm, that still results in approximately a 42 times improvement.

Figure 7:
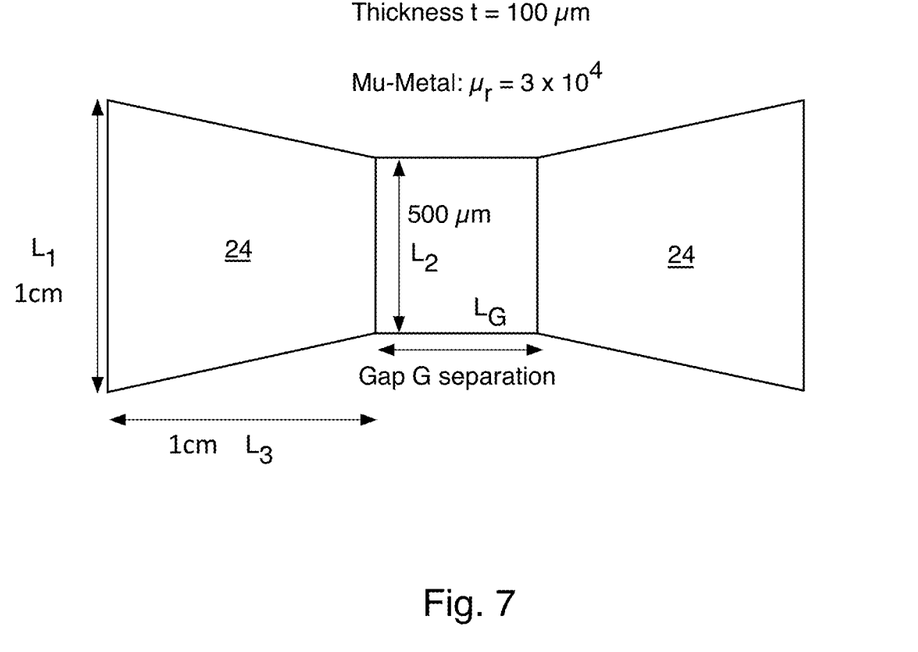
FIGS. 7 and 8 demonstrate an enhancement factor due to the presence of local magnetic field concentrators with a varying gap spacing between them but with a fixed thickness.
Figure 8:
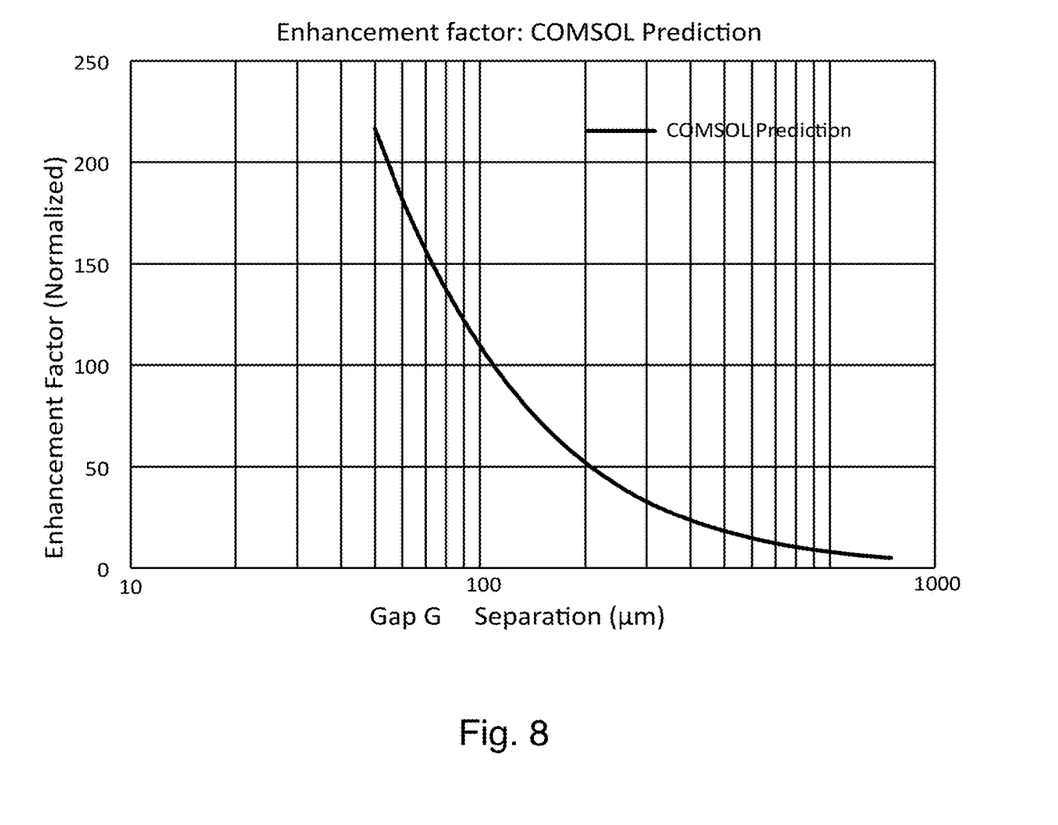

FIG. 7 is a schematic representation of a pair of flux concentrating pole pieces 24 having a fixed thickness $t_{24}$ equal to 100 µm but with a gap G varying between 40 and to over 1000 µm. The field enhancement was modeled with an FEA modeling tool and FIG. 8 shows roughly 100× enhancement for a 100 µm gap at an operating frequency around 840-900 MHz. A 200× enhancement would be expected with a 1 GHz resonator having a width of only 25 µm and a gap G spacing of about 45 µm. Lower frequency resonators still within the UHF band should be able to fit within a gap G spacing of 100 µm.

The Broadband Integrated RF Magnetic Antenna taught by U.S. Provisional Patent Application Ser. No. 62/678,897, filed May 31, 2018 is sensitive into the low pico-Tesla range (approaching 2.5 pT/√Hz). See the paper entitled "Wideband multiferroic quartz MEMS antennae" which was presented on or about Dec. 4, 2018 at POWER MEMS 2018. The present disclosure demonstrates enhancement factors of around 100 or better so the disclosed resonator with a pair of the disclosed flux concentrating pole pieces 24 should be sensitive into the low femto-Tesla range (perhaps as low as 25 fT/√Hz or even better).

The pole pieces (or flux concentrators) 24 are depicted in the figures as being trapezoidal with straight edges. Note the dimensions given on FIGS. 5 and 7; the edge of the trapezoidal-shaped flux concentrators 24 immediately adjacent the resonator 8 (having a length $L_2$) is preferably much smaller than the lengths $L_1$ and $L_3$ of other sides thereof. It should be apparent that other shapes for the flux concentrators 24 should be useful and thus they need not necessarily be of a trapezoidal-shape as depicted herein. Also, the edges need not be straight as depicted. For example, the side edges (depicted with dimensions $L_3$) may be curved to follow the expected shapes of the lines of flux 23 depicted by FIG. 4.

Other shapes are also possible for both the sides and the ends (depicted with dimensions $L_1$ and $L_3$) of the flux concentrators 24 if desired.

Having now described the invention in accordance with the requirements of the patent statutes, those skilled in this art will understand how to make changes and modifications to the present invention to meet their specific requirements or conditions. Such changes and modifications may be made without departing from the scope and spirit of the invention as disclosed herein.

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration of those advancements, namely in accordance with the then current state of the art. It is intended that the scope of the invention be defined by the Claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the Claims. No claim element herein is to be construed under the provisions of 35 U.S.C. Section 112, as it exists on the date of filing hereof, unless the element is expressly recited using the phrase "means for . . . " and no method or process step herein is to be construed under those provisions unless the step, or steps, are expressly recited using the phrase "comprising the step(s) of . . . ."

Modifications, additions, or omissions may be made to the systems, apparatuses, and methods described herein without departing from the scope of the invention. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

What is claimed is:

1. A RF antenna or sensor comprising a magnetostrictive film disposed on resonator material in which high permeability pole pieces are located adjacent to the magnetostrictive film occupying at least the same vertical plane as the magnetostrictive film for the purpose of enhancing the magnetic field strength in the magnetostrictive film of the resonator.

2. The RF antenna of claim 1 wherein the high permeability pole pieces each have a trapezoidal, triangular or wing shape.

3. The RF antenna of claim 1 wherein the high permeability pole pieces are disposed on a common substrate and the resonator material is bonded to said common substrate.

4. The RF antenna of claim 1 in which a gap G spacing between the high permeability pole pieces is smaller than a width of each of said pole pieces.

5. The RF antenna of claim 4 wherein the resonator is disposed within said gap G but spaced from each of the high permeability pole pieces.

6. The RF antenna of claim 5 in which the high permeability poles each have a tip width located remotely from the resonator which is less than or equal to 1 mm.

7. The RF antenna of claim 3 in which the common substrate is a semiconductor material.

8. The RF antenna of claim 3 in which the resonator is a temperature-compensated quartz shear-mode resonator bonded to said common substrate.

9. The RF antenna of claim 7 in which the resonator is bonded to said common substrate with a low temperature metal eutectic bonding material such as Au/In or Au/Sn.

10. The RF antenna of claim 1 in which the magnetostrictive film comprises at least a magnetostrictive or magnetoelastic material disposed on an electrically conductive electrode which in turn is disposed on a cantilevered bar or body of quartz material of the resonator and wherein the magnetostrictive or magnetoelastic material has a piezomagnetic coefficient which is equal to or greater than 1 ppm/Oe.

11. The RF antenna of claim 1 in which the high permeability pole pieces have a relative permeability greater than 1000.

12. A RF antenna or sensor comprising:
a substrate;
a resonator operable at at least UHF disposed on said substrate, the resonator having a quartz bar with electrodes disposed on opposing major surfaces thereof and with a magnetostrictive or magnetoelastic material disposed on or covering at least one of said electrodes, the resonator being disposed on a substrate;
a pair of trapezoidal, triangular or wing shaped high permeability pole pieces supported by said substrate and disposed confronting said resonator, one of said pair of pole pieces being disposed on side of said resonator and the other one of said pair of pole pieces being disposed on an opposing side of said resonator, the pair of high permeability pole pieces being spaced apart by a gap G, the resonator being disposed within said gap G.

13. The RF antenna or sensor of claim 12 wherein the gap G is no greater than 100 µm.

14. The RF antenna or sensor of claim 12 wherein a major portion of the gap G is no greater than 100 µm.

15. The RF antenna or sensor of claim 12 wherein the high permeability pole pieces are disposed adjacent the magnetostrictive or magnetoelastic material and supported so that the high permeability pole pieces occupy at least a common vertical plane with the magnetostrictive or magnetoelastic material.

16. The RF antenna or sensor of claim 15 wherein the high permeability pole pieces each have a thickness which is greater than a thickness of the resonator.

17. The RF antenna or sensor of claim 16 wherein the high permeability pole pieces each have a thickness which varies such that the thickness decreases nearer to the resonator or increases farther from the resonator.

18. The RF antenna or sensor of claim 16 wherein the high permeability pole pieces are substantially centered (height-wise) relative to the quartz bar.

19. The RF antenna of claim 12 wherein the magnetostrictive or magnetoelastic material disposed on or covering at least one of said electrodes has a piezomagnetic coefficient which is equal to or greater than 1 ppm/Oe.

20. The RF antenna of claim 19 wherein said electrodes are electrically conductive electrodes and wherein the quartz bar comprises a cantilevered bar or body of quartz material supported from one end thereof by said substrate.

\* \* \* \* \*